United States Patent [19]

Boonstra

[11] Patent Number: 4,583,150
[45] Date of Patent: Apr. 15, 1986

[54] PRINTED CIRCUIT BOARDS

[75] Inventor: Edward L. Boonstra, Elk Grove Village, Ill.

[73] Assignee: Methode Electronics, Inc., Chicago, Ill.

[21] Appl. No.: 774,398

[22] Filed: Sep. 10, 1985

Related U.S. Application Data

[63] Continuation of Ser. No. 459,979, Jan. 21, 1983, abandoned.

[51] Int. Cl.⁴ .............................................. H05K 1/02
[52] U.S. Cl. ................................ 361/406; 174/35 R; 174/68.5; 361/409
[58] Field of Search ...................... 361/404, 406, 409; 174/68.5, 35 R

[56] References Cited

U.S. PATENT DOCUMENTS

| | | | |
|---|---|---|---|
| 3,546,539 | 12/1970 | Wilcox et al. | 174/68.5 X |
| 3,740,678 | 6/1973 | Hill | 174/68.5 X |
| 4,031,371 | 6/1977 | Devries | 174/68.5 X |
| 4,157,612 | 6/1979 | Rainal | 174/32 X |
| 4,330,684 | 5/1982 | Hayward | 174/68.5 |
| 4,494,172 | 1/1985 | Leary et al. | 174/68.5 X |
| 4,498,122 | 2/1985 | Rainal | 174/68.5 X |

*Primary Examiner*—R. R. Kucia
*Attorney, Agent, or Firm*—Charles F. Pigott, Jr.

[57] ABSTRACT

A circuit board capable of accommodating a condensed number of integrated circuit components by being divided into sections to permit the mounting of devices of assorted pin spacings. In another embodiment, a leadless, integrated circuit device may be mounted on the board with increased grounding elements to increase electrical isolation of the leadless chip carrier for better operative results. The circuit board herein disclosed is also arranged to provide a dual voltage plane to accommodate different electrical requirements presented by using a number of integrated circuit packages.

11 Claims, 7 Drawing Figures

PRINTED CIRCUIT BOARDS

This is a continuation of application Ser. No. 459,979 filed Jan. 21, 1983, now abandoned.

BACKGROUND OF THE INVENTION

This invention relates in general to improved electrical components and, in particular, to different embodiments of logic circuit boards capable of interconnecting integrated circuit (IC's) devices and the like in an electrical circuit.

More specifically, but without restriction to the particular use which is shown and described, this invention relates to improved circuit or logic boards upon which IC packages, additional VLSI devices, and other components can effectively be interconnected in an electrical circuit. The circuit board of the invention provides a high density package capable of accommodating a greater number of different types of IC packages and the like as compared to the prior art. The invention herein disclosed also includes means for providing a dual voltage plane to better match the electrical requirements of the IC devices which are mounted on the board. The circuit board of the invention is further improved by an enhanced electrical grounding technique that protects and isolates connected IC circuits, particularly leadless, chip carrier sockets.

Printed circuit boards are commonly employed as an interface interconnecting IC devices and other components with the circuitry of a computer and the like. One type of circuit board commonly used in such applications mounts a plurality of typical IC devices which are connected to the circuit by a wrappable pin connection as is well-known. In many of such boards, a single voltage plane is provided on one side, while a ground plane exists on the opposite surface. The use of a single voltage plane, as is commonly provided in the prior art, renders the interconnection of a number of integrated circuit devices, many of which may have different electrical requirements, heretofore unsatisfactory.

In the past, the diverse electrical requirements of IC devices are often handled during the wire wrap process, by which the power to each pin is modified as needed. Wire wrapping permits dual voltage connections to be made through a "daisy-chain" which is detrimentally subject to breaks in pattern or poor reliability in use. Other boards having printed circuits require a physical modification of the etched, printed circuit to accommodate multiple voltages. Such physical alteration of the etched circuit is not readily accomplished nor are the results of these modifications wholly satisfactory. In general, prior designs are therefore incapable of readily and effectively meeting the varying electrical requirements of the components that must be accommodated by a circuit board.

Another problem associated with known circuit boards is the inability of these components to accommodate a range of pin spacings of different IC packages. In the prior art, terminals have been generally arranged in rows separated by an identical spacing, such as, for example, 0.300 inches apart. This known universal pattern, providing equal spacing between pin rows, limits the number and density of components having a number of different pin widths which can be accepted.

Based on design considerations, it is also highly desirable to employ a leadless, integrated circuit in the form of a chip mounted within a carrier as a component in computer circuits, since the device offers distinct, operative benefits. A leadless chip is faster and more sensitive than a conventional IC device. In the use of leadless chips, however, it is extremely important to protect its electrically dense circuitry from outside influences. Interference or noise imposed on a leadless chip carrier can result in a disruption of its capability for high performance. To insure its optimum level of operation, it is important that the chip be isolated as much as possible from the surrounding circuitry in order to attain effective operation. Known circuit boards have failed to provide means by which a leadless chip carrier is effectively shielded and grounded to optimize its performance and sensitivity within the circuit to which it is connected.

SUMMARY OF THE INVENTION

It is, therefore, an object of this invention to create a more dense integrated circuit package for interconnection in an electrical circuit.

Another object of this invention is to provide an improved circuit board providing a dual voltage plane to handle the electrical requirements of IC devices and the like.

A further object of this invention is to improve the effective grounding of devices mounted on an interface circuit board.

Still another object of this invention is to better shield or ground a leadless chip carrier circuit mounted on a circuit board.

Another object of this invention is to impose mettalic means between signal pins mounted on a circuit board to reduce noise and cross-talk.

A further object of this invention is to maximize the usable number of pins per column provided on a circuit board.

These and other objects are attained in accordance with the present invention wherein there is provided an improved circuit board for mounting one or more IC devices or other components for interconnection with an electrical circuit. The board of the invention is capable of providing a dual voltage plane in order that the particular voltage requirements of various IC devices mounted on the board can be better handled. The board of the invention is further provided with means to isolate leadless chip carriers mounted on the board through effective grounding. In addition, metallic elements are mounted between each pair of signal pins to insure reduction of noise and cross-talk for greater isolation of the chip component.

DESCRIPTION OF THE DRAWINGS

Further objects of the invention together with additional features contributing thereto and advantages accruing therefrom will be apparent from the following description of preferred embodiments of the invention which are shown in the accompanying drawings with like reference numerals indicating corresponding parts throughout, wherein.

DESCRIPTION OF THE PREFERRED EMBODIMENTS

Figure 1:
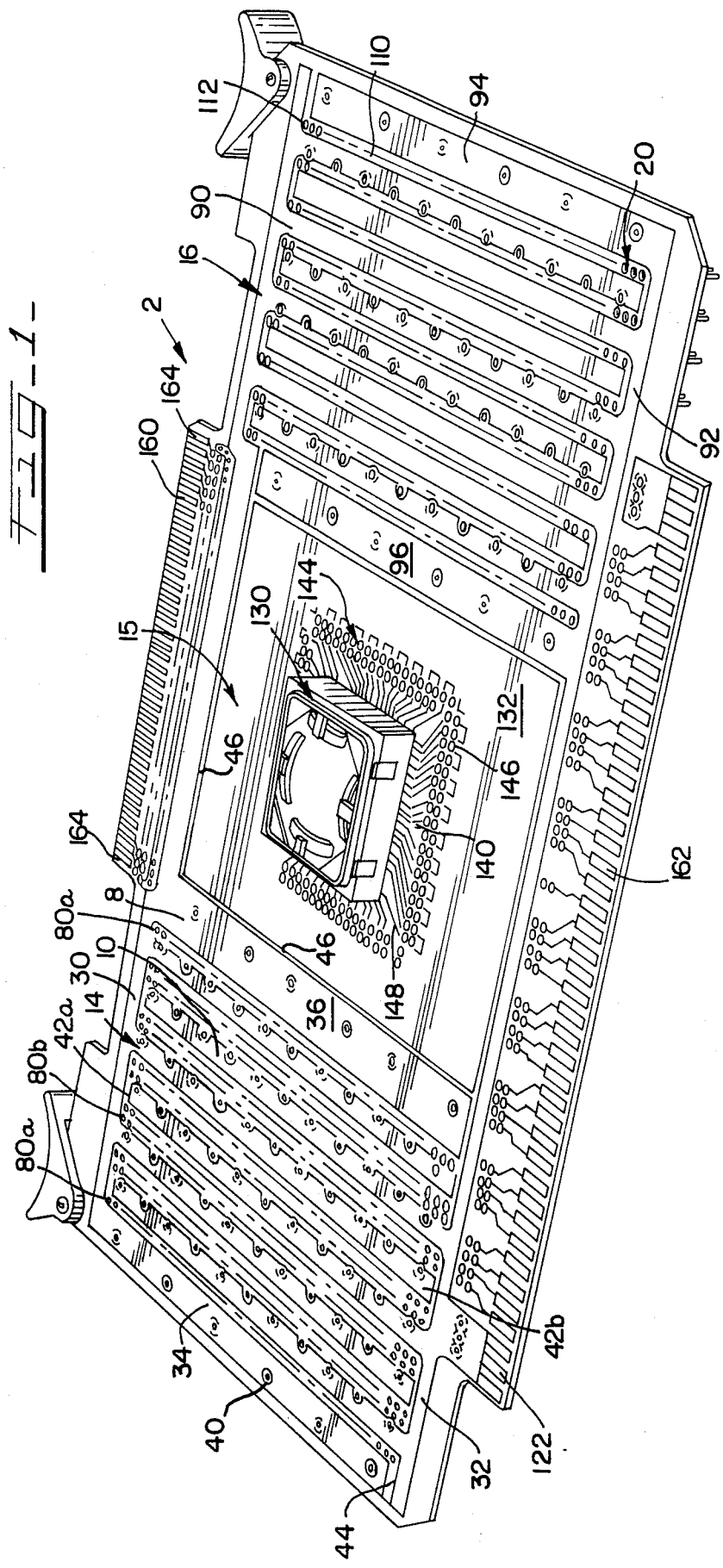
FIG. 1 is a front perspective view of a first embodiment of the logic circuit board of the invention having a chip carrier socket mounted thereon.

Referring now to FIGS. 1 to 5, there is illustrated a first embodiment of the printed circuit or logic board of the invention, generally designated by the reference numeral 2. The board 2 is fabricated from a suitable electrical insulating material or dielectric, and is formed with a generally flat, rectangular configuration having opposed surfaces 4 and 6. The first surface 4 provides a component mounting side establishing a voltage side, while opposite surface 6 serves as wire wrap side on which a continuous ground plane is effected. In general, both voltage plane 4 and ground plane 6 include a conductive metal foil pattern 8 and 8' suitable affixed to board 2 to form conductive areas 10, 10' and non-conductive areas 12, 12' on surfaces 4 and 6.

Figure 2:
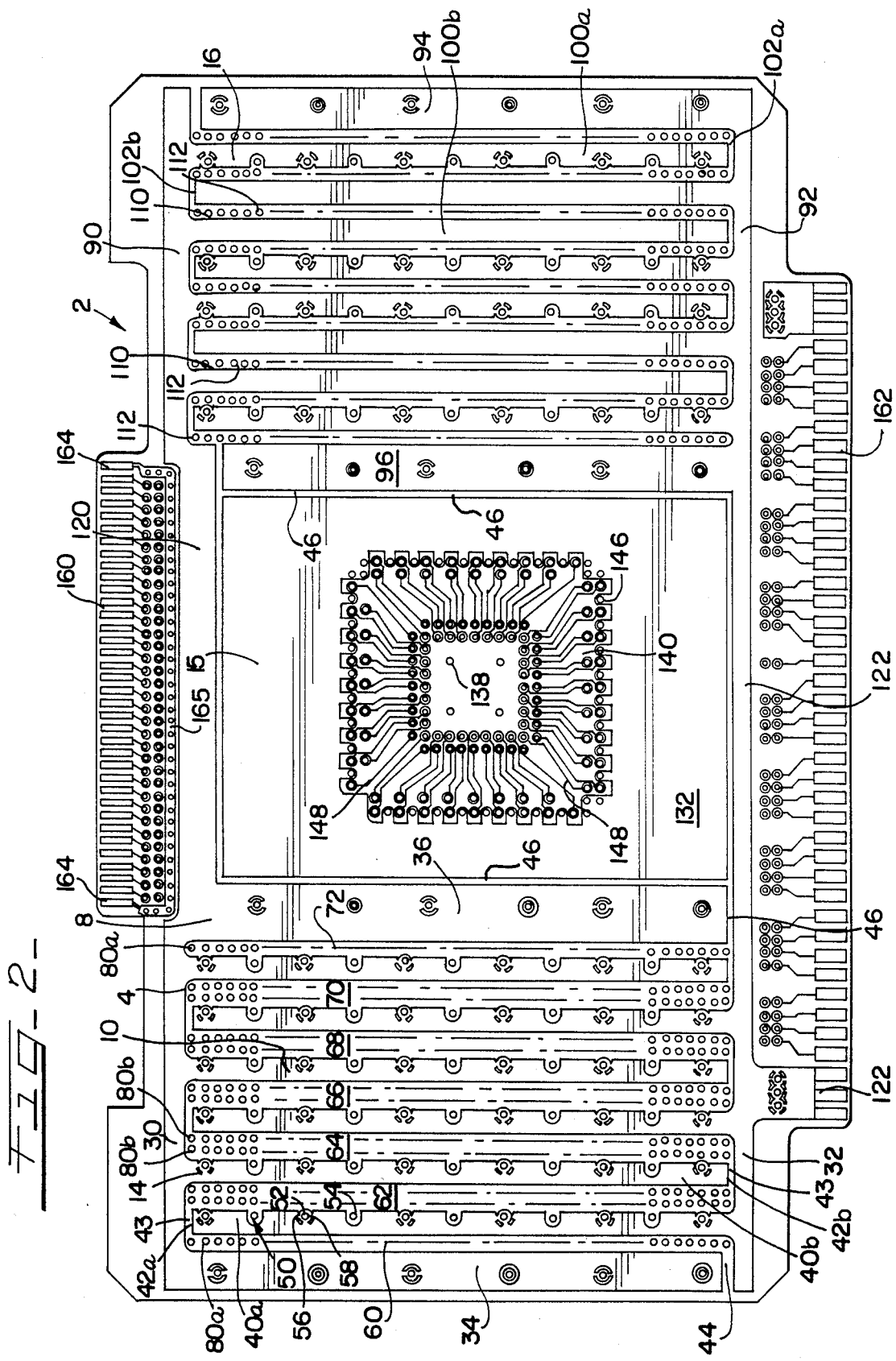
FIG. 2 is a top plan view of the component side or voltage plane of the logic circuit board of FIG. 1.
Figure 3:
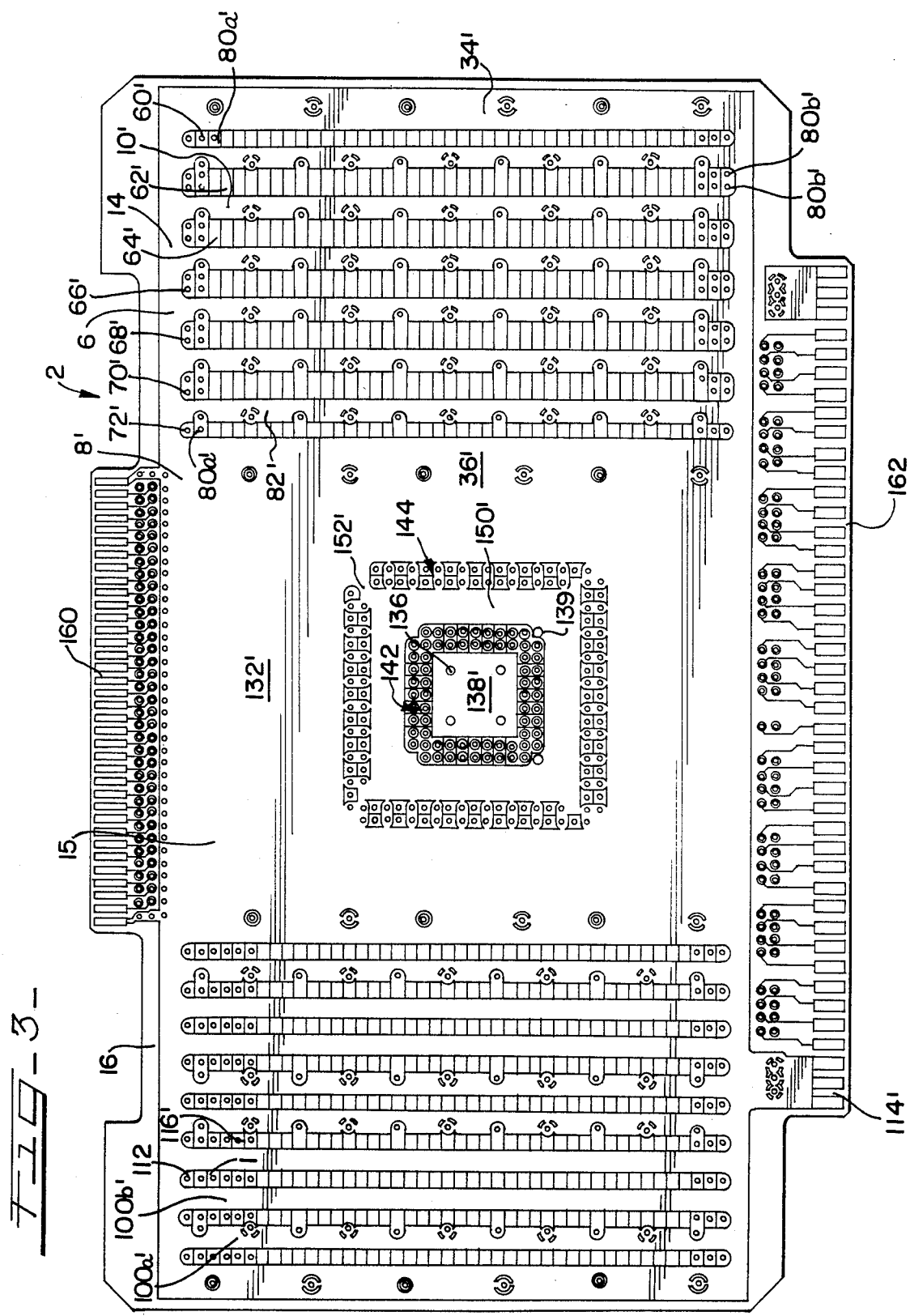
FIG. 3 is a bottom plan view of the wire wrap side or ground plane of the circuit board of FIG. 1.

As best shown in FIGS. 1 to 3, the circuit board 2 is divided into three component mounting sections 14, 15 and 16. A plurality of holes or openings arranged in rows, as also will be described, extend from the component side 4 to the wire wrap side 6 in end sections 14 and 16 of the board. Each of the holes, or at least a portion thereof, receive a respective terminal 20 of conventional design. (FIG. 1). Terminals 20 have socket contact ends on the voltage plane to act as sockets and receive the male pin of integrated circuit packages or other electrical components. The terminals 20 extend beneath the ground plane side 6, and appropriate terminal ends are interconnected with the electrical circuit, in which the board serves as an interface, by a typical wire wrapping technique as is well known in the art.

In component receiving section 14, conductive foil 8 is formed with upper and lower border strips 30 and 32, an edge strip 34, and an inner portion 36 extending parallel to strip 34. A plurality of intermeshing, elongated sections 40a and 40b of conductive foil, alternately projecting from border strips 30 and 32, lie in parallel relationship to edge strip 34. The ends 42a and 42b of elongated sections 40a and 40b are electrically isolated by non-conductive area 43 from its opposite border strip 30 or 32. In addition, non-conductive areas 44 and 46 are respectively provided in edge foil strip 34 and inner portion 36 to create a dual voltage plane on component side 4 as will be apparent. The inner portion 36 is further bordered by one of four elongated, non-conductive strips 46 in the form of a square defining central section 15 which will also be described.

A number of holes 40 through board 2 are suitably spaced along edge strip 34 and inner strip 36 to form alternate voltage and ground terminals in a conventional manner. A plurality of terminal receiving holes 50 are further spaced along each of the elongated sections 40a and 40b and alternately, function as voltage terminals 52 and ground terminals 54. The voltage terminals 52 are in conductive relationship with elongated sections 40a and 40b by a means of strips 56 extending from their associated solder pads 58. Although other numbers of terminals 50 may be employed dependent on design considerations, eleven are shown in FIGS. 1 to 3, with the centers of each terminal being spaced by 0.400 inches in a standard manner.

The intermeshing elongated sections 40a and 40b are spaced from each other by elongated, non-conductive sections 60, 62, 64, 66, 68, 70 and 72, extending in parallel relationship between the upper and lower conductive sections 30 and 32. Outer sections 60 and 72 are provided with a single row of equally spaced, terminal receiving holes 80a, while the remaining sections 62, 64, 66, 68, and 70, include two rows of in-line terminal receiving holes 80b, each equally separated between centers by the same distance as holes 80a. The pair of rows of holes 80b are spaced from each other in respective sections 62–70, by the same distance as their in-row spacing.

Although the invention is not intended to be so limited and other numbers of holes may be employed, a total of forty-four (44) holes 80a and 80b are shown in FIG. 2 positioned along each row in sections 60-72. The holes 80a, 80b may be equally spaced along a row by any distance suitable to accept the pins of known components in terminals 20, such as, for example, a distance between centers of 0.100 inches, as is conventional. In the foregoing example, it should also be apparent that holes 80b in adjacent pairs of rows in each section 62–70 are also spaced by a distance of 0.100 inches. In addition, the spacing of immediate rows of holes 80a, 80b on opposite sides of elongated sections 40a, 40b is greater than their in-row spacing and may be, for example, three times greater, or 0.300 inches, if a 0.100 inch in-row spacing is present as previously described. As shown in FIG. 3, section 14 on the ground plane side 6 is similarly arranged on component side 4, except that the insulating voids in the conductive foil 8' at the end of the elongated sections and bordering areas are replaced by a continuous conductive foil. The corresponding components in FIG. 3 are designated with the same reference numeral as on side 4 with the notation "prime". Conductive strips 82' between holes 80a' and 80b' are included in ground plane 6, a provision not made on voltage plane 4.

The unique pattern of holes in section 14 allows it to accept a maximum number of pins per column and hence an increased number of different packages, such as, for example, IC components having a narrow pin width of 0.300 inches or a wider pin separation of 0.400 inches. The provision of closely spaced rows and others with wider in-spacing section 14 provides increased versatility and the ability to accept a maximum number of separate components having numerous combinations of pin spacings. It should be understood, however, that modifications of the number of and relative spacing of the rows in FIGS. 1 to 3 may be made in accordance with the present invention, dependent on design considerations and service requirements.

Referring now to FIGS. 1 and 2, there is further shown a modified arrangement of intermeshing conductive foil fingers in section 16 of the board 2, in which the relationship between pin rows is varied in comparison to section 14, such that the acceptance of other IC components may be effected. In section 16, upper and lower conductive strips 90 and 92, edge strip 94 and inner strip portion 96 are similar to the corresponding areas in board section 14. Elongated sections 100a and 100b intermesh in the same manner as the fingers 40a and 40b in section 14, and corresponding signal and ground terminals are present in at least a portion of the conductive areas 40a, 40b.

Elongated sections 100a and 100b respectively terminate at ends 102a and 102b which are physically spaced from upper or lower border strip 90 or 92. Elongated sections 100a, 100b are further spaced from either edge strip 94, inner portion 96, or an adjacent section by an elongated, non-conductive sections 110. A single row of a plurality of holes 112 for receiving terminals 20 are arranged in sections 110 and are spaced by the same relationship as holes 80a, 80b in section 14. In addition, the rows 112 are spaced from an adjacent row by a center spacing of holes equal to approximately three times the in-row separation, such as, for example, 0.300 inches. Such a row pattern in section 16 permits the mounting of a maximum number of components employing various pin spacings including 0.300, 0.600 and 0.900 inches spaced devices and the like. The ground side 6 of section 14 includes corresponding non-conductive areas as the voltage plane 4, except that the non-conductive breaks in elongated sections 100a', 100b' and the bordering foil portion are removed for purposes of creating a ground plane through a ground connection, which is also in conductive relationship with sections 14, 15 and 16. The holes 112 are separated by conductive strips 116'.

Referring to FIG. 2, conductive foil areas 120 and 122 on side 4 electrically connect separated areas of conductive foil 10 in sections 14 and 16 for forming a dual voltage plane created by separate power sources (not shown) at terminals 112 and 124. For example, alternate conductive sections in both sections 14 and 16 will be connected to separate voltage sources as are the bordering foil portions to create primary and secondary voltage planes.

Figure 4:
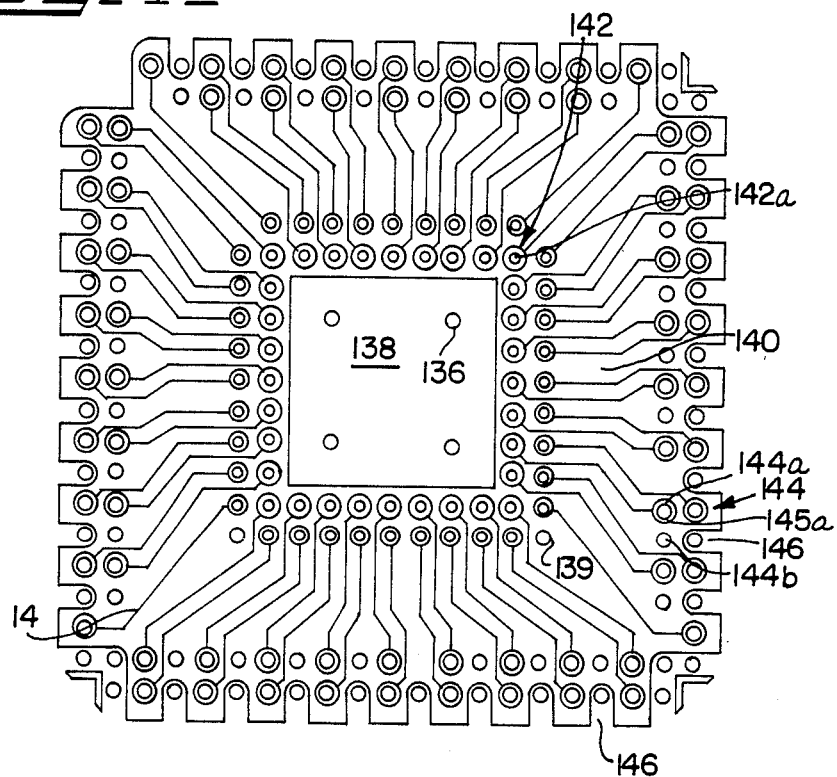
FIG. 4 is a partial enlarged view, with additional details shown, of the central section of the component side or voltage plane of logic board of FIG. 2.
Figure 5:
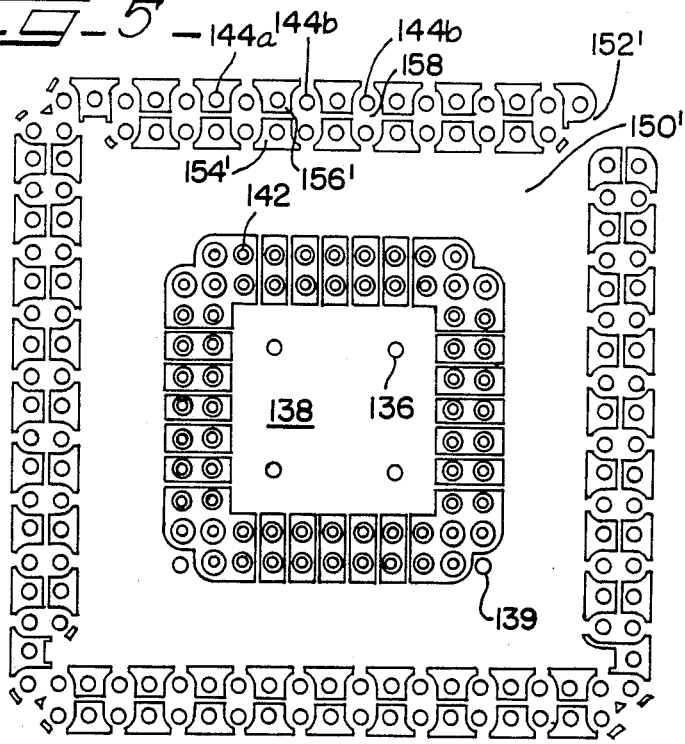
FIG. 5 is a partial, enlarged view, with additional parts shown in detail, of the center section of the wire wrap side or ground plane of the circuit board as shown in FIG. 3.

Referring now to FIGS. 1, 2 and 3, there is illustrated the center portion 15 of the board 2 in which a leadless chip carrier socket 130 of conventional design may be mounted, such as, for example, an industry designated JEDEC Type "A" leadless chip carrier socket. On voltage plane side 4, section 15 includes an outer portion 132 of conductive material electrically separated from the remainder of the board by non-conductive strips 46 enclosing conductive area. The outer portion 132' on the ground side 6 in FIG. 5 is in continuous relationship with the conductive areas 10' of sections 14 and 16 to function as ground plane. In FIGS. 2 to 5, four plated through holes 136 forming a mechanical interface are disposed in the central portion of the section 15 in a foil area 138 of voltage plane 4 and foil area 138' on the ground plane. A pair of socket polarization holes 139 are also provided in non-conductive area 140 as best shown in FIGS. 3, 4 and 5.

The central foil area 138 is shaped as a square or whatever other shape is compatible with the chip carrier. A non-conductive area 140 surrounds the central area 138 and is also substantially square in configuration. Each side of the central conductive portion 138 is surrounded by adjoining pairs of terminal receiving holes 142 that permit the pins of the chip socket to plug right into the board 2 into terminals 142a. The outer periphery of the non-conductive area 140 includes a plurality of adjoining pairs of holes 144a, 144b, in which hollow terminals 145a, 145b may be mounted as shown in FIG. 4. In FIGS. 2 and 4, there exists approximately twice the number of terminals 145a, 145b, as socket terminals 142a for reasons to be described.

The outer hole of alternate pairs of holes 144a are situated in conductive projections 146, extending inward from the conductive area 132. Each of the chip carrier pin terminals 142a are connected to a terminal 145a by means of a copper lead 148 electrically interconnecting the two points. Pins 145a are soldered on the voltage side, but not on the ground side. Pins 145b are soldered on the ground plane. The terminals 145a in holes 144a thus function as signal pins, whereas the terminals 145b, extending through holes 146b, create ground terminals. It should be clear, therefore, that adjacent pairs of signal terminals 145a are separated by a pair of metallic ground terminals 145b on both component side 4 and ground side 6. The presence of metalization between signal pins 145a reduces noise and crosstalk to better isolate the chip carrier mounted on the voltage side for the board.

Referring to FIG. 5, a corresponding pattern of foil is present on ground side 6 including a conductive area 150' existing between the socket pin terminals 142 and the terminals 145a, 145b. The conductive foil area 150' is in conductive relation with the outer area 134' on ground side 6 by means of a conductive strip 152'. The signal terminals 145a may be interconnected on ground side 6 with an electric circuit by a wire wrap technique. Each of the signal pins in holes 144a is situated in a dielectric area 154' separated by a non-conductive strip 156', while the ground pins are in conductive sections 158.

Socket carrier 130 is further electrically and mechanically isolated from the circuit, in which it is connected, by the fact that the conductive areas 132 form electrical grounded areas on both the component side 4 as well as area 132' on the ground side 6. The board 2 also is provided with an edge connector 160 which permits coupling in a suitable manner to a bus and the like. A plurality of contacts 162 on the lower side of board 2 are also provided in a conventional manner. In the edge connector 160, the two end contacts 164 are also grounded and electrically connected by strip 165 to serve as a termination point for grounded pairs of wires. The remaining structure of the edge connector 160 and contacts 162 are otherwise of a conventional nature and need not further be described for an understanding of the invention. Because of the electrical isolation of the chip carrier by the board 2 of the invention; the sensitivity of circuitry thereof is less subject to interference and noise from outside sources than prior art techniques to prevent it from functioning in its intended manner.

Figure 6:
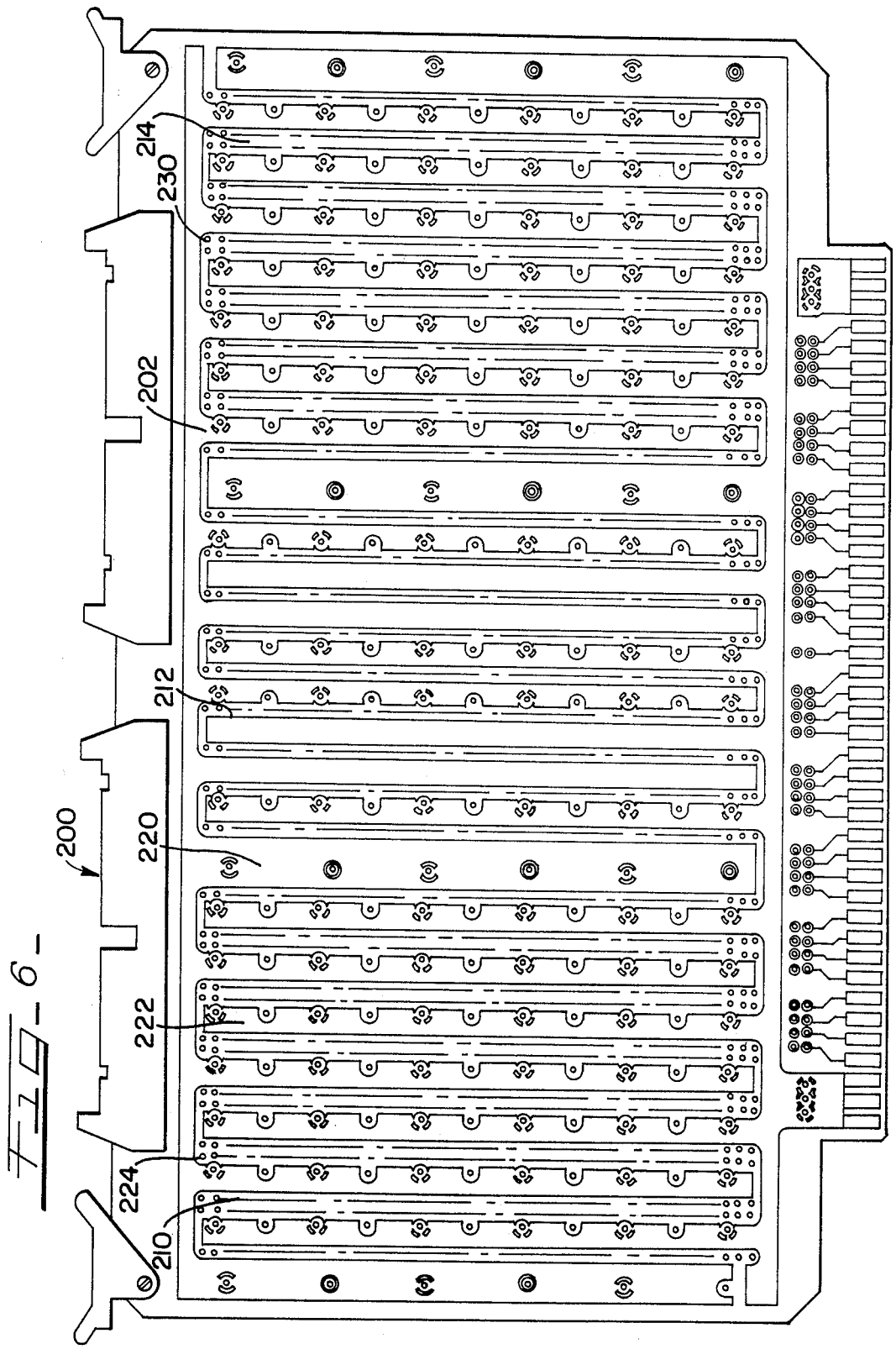
FIG. 6 is a plan view of a second embodiment of the component side or voltage plane of a printed circuit board of the invention; and, FIG. 7 is a plan view of the wire wrap side or ground plane of the embodiment of the circuit board of FIG. 6.
Figure 7:
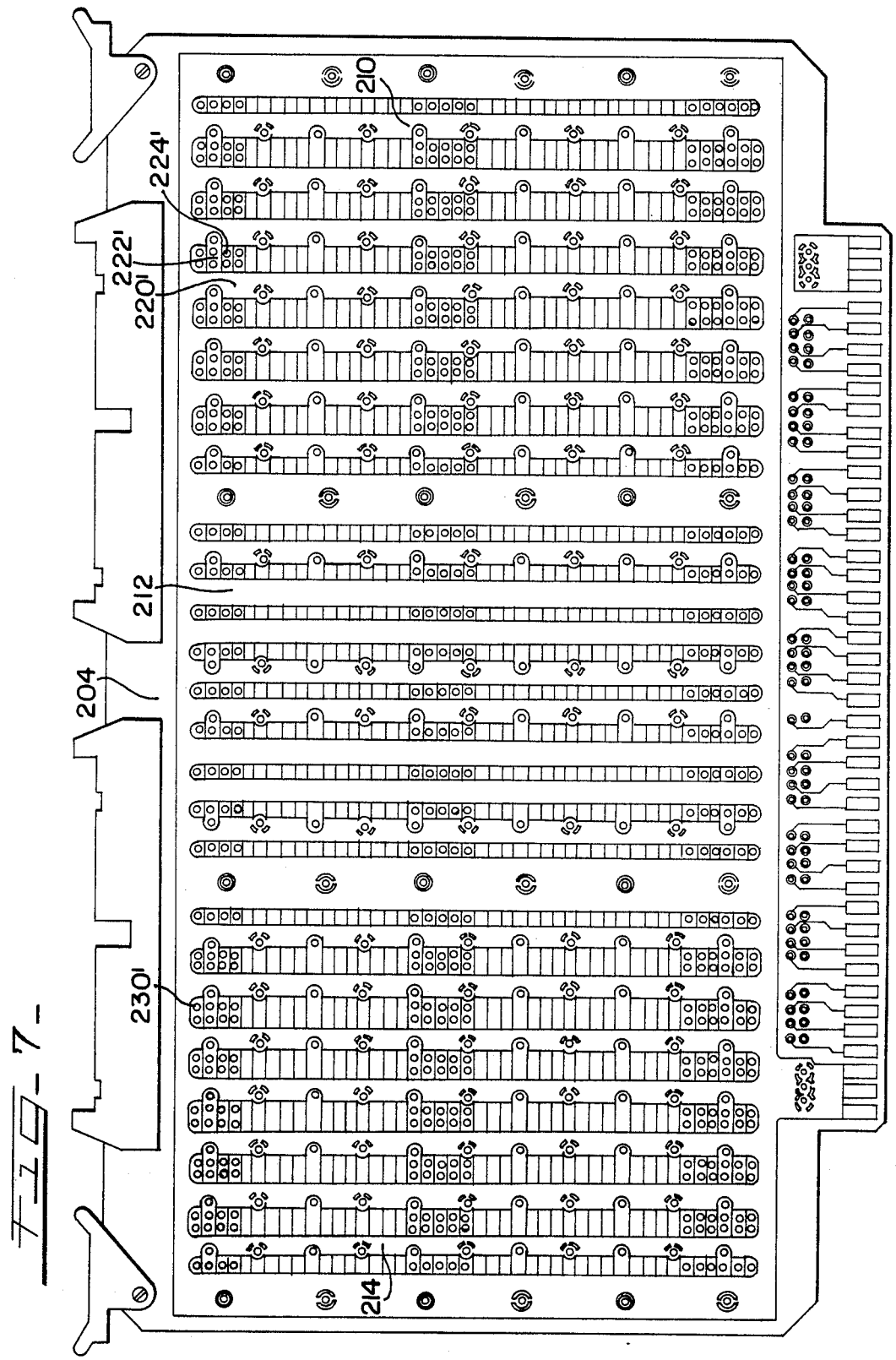

Referring now to FIGS. 6 and 7, there is illustrated another embodiment of the logic circuit board of the invention which is generally designated by the reference number 200. The circuit board 200 generally is fabricated from the same material and is of the same configuration as the preceeding embodiment, possessing a component side 202 forming a voltage side and a ground plane side 204. Logic board 200 is divided into three respective sections 210, 212 and 214. The end section 210, as shown in FIGS. 6 and 7, is substantially identical to the pattern of conductive areas 220 and conductive areas 222, as well as the rows of terminal receiving holes 224, as was described with reference to section 14 of the embodiment of FIGS. 1–5. Similarly, in a reversed orientation, the end section 214 is similar to section 210 and includes the in-line rows of holes 230 also spaced in the same relationship as section 14 in the preceeding embodiment. The chip carrier socket in section 15 at the central portion of the board has been replaced in the embodiment of FIGS. 6 and 7 by an IC component mounting section essentially corresponding to the row spacing described with reference to FIGS. 3 and 4 and shown as section 16 in the preceeding embodiment. Thus, it should be apparent that a pattern of rows of holes and terminals, as well as conductive and non-conductive areas, previously described with reference to section 14, has been incorporated as section 210 and 214 in the present embodiment in FIGS. 6 and 7.

In addition, in the embodiment of FIGS. 6 and 7, the leadless chip section 15 has been replaced by section 212, having the pattern of conductive and non-conductive areas and rows of holes, described with reference to section 16 in the present embodiment of FIGS. 1 to 5. The provision of three sections, two of which have similar patterns, permits the accommodation of a still increased number of IC packages and the like having a range of pin spacings for a more condensed board package. It is further within the scope of the invention to vary the pattern of rows within section 210, 212 and 214, dependent upon design considerations, whereas the outside two of the sections may include an arrangement, such as shown in section 212, or any other variation as is desired. Thus, modifications may be made to pin spacings as long as the intent of the invention to accommodate components with an optimumly dense package is attained.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An electric circuit board for interconnecting one or more components in an electrical circuit, said circuit board comprising:
   a base member formed from non-conductive material, said base member including opposed surfaces to provide a first side to accommodate electrical components and a second, ground side,
   said base member being provided with a plurality of aligned rows of terminal-receiving holes for interconnecting the pins of one or more of the components with a circuit electrically connected to said base member on said ground side,
   said first side being partially covered with a conductive layer of material forming alternate intermeshing exposed areas of non-conductive areas and conductive areas,
   means for electrically isolating a first portion of said conductive area from a second portion thereof, each of said portions defining a plurality of interconnected fingers distributed across most of the entire first side of said circuit board, and
   means for creating a dual voltage plane on said first side of the base member by coupling separate voltage sources respectively to said first and second portions of said conductive areas.

2. The circuit board according to claim 1 further comprising a plurality of terminals mounted in said plurality of holes in said base member, said terminals having an end for receiving the pin of an electrical component on said first side and wire wrappable terminal ends extending from said second side of said base member.

3. The circuit board according to claim 2 wherein said first side is divided into at least a first and second section having a plurality of rows of said terminals, some of said rows of terminals in said first section being spaced from an adjacent row by a distance less than the spacing between some of said rows of terminals in said second section.

4. The circuit board according to claim 3 wherein some of said rows of terminals in said first section are spaced from an adjacent row by the distance equal to the spacing of said terminals along each row.

5. The circuit board according to claim 4 wherein adjacent rows of said second section are spaced by a distance greater than the spacing of said terminals along said rows.

6. The circuit board of claim 1 in which fingers of each of the respective portions are positioned between fingers of the other portion.

7. The circuit board of claim 6 in which said base member has a plurality of rows of contact-receiving holes, a plurality of conductive contacts positioned in said contact-receiving holes, some of said contacts being grounded and other of said contacts being connected to signal source means, said grounded contacts being disposed between adjacent signal source-connected contacts for reducing cross-talk therebetween.

8. The circuit board of claim 7 in which the contacts connected to said signal source means are terminals having an end for receiving the pin of an electrical component on said first side, and also having wire wrappable terminal ends extending from the second side of said base member.

9. The circuit board of claim 8 in which said side is divided into at least a first and second section having a plurality of rows of said terminals, some of said rows of terminals in said first section being spaced from an adjacent row by a distance of less than the spacing between some of said rows of terminals in the second section.

10. The circuit board according to claim 9 wherein some of said rows of terminals in said first section are spaced from an adjacent row by a distance equal to the spacing of said terminals along each row.

11. The circuit board according to claim 10 wherein adjacent rows of terminals of said second section are spaced by a distance greater than the spacing of said terminals along said rows, the spacing of rows in said first and second sections acting to permit the mounting of an increased number of electrical components of varying pin spacings.

* * * * *